United States Patent

[11] 3,634,159

[72] Inventor William Fletcher Croskery
Toronto, Ontario, Canada

[21] Appl. No. 49,425
[22] Filed June 24, 1970
[45] Patented Jan. 11, 1972
[73] Assignee Decca Limited
London, England

[54] ELECTRICAL CIRCUITS ASSEMBLIES
14 Claims, 6 Drawing Figs.

[52] U.S. Cl. .......... 156/3,
96/36.2, 117/212, 156/8, 156/11, 174/68.5, 204/15, 204/23, 252/79.1, 252/79.2, 252/79.5
[51] Int. Cl. .......... C23f 1/02
[50] Field of Search .......... 29/624–626; 96/36.2; 117/210–212, 107, 107.2, 113, 114, 50, 51; 156/3, 8, 11; 174/68.5; 204/15, 23; 252/79.1, 79.2, 79.5; 317/101

[56] References Cited

UNITED STATES PATENTS

| | | | |
|---|---|---|---|
| 3,217,209 | 11/1965 | Kinsella et al. | 156/3 X |
| 3,256,588 | 6/1966 | Sikina et al. | 117/212 X |
| 3,423,205 | 1/1969 | Skaggs et al. | 156/3 X |
| 3,423,260 | 1/1969 | Heath et al. | 156/3 |
| 3,529,350 | 9/1970 | Rairden | 156/3 X |
| 3,554,821 | 1/1971 | Caulton et al. | 156/3 |

*Primary Examiner*—William A. Powell
*Attorney*—Mawhinney & Mawhinney

ABSTRACT: A method of forming a two-dimensional electrical circuit assembly. A substrate is coated with a thin gold layer. The gold layer is removed from marginal areas not associated with the regions of conductive elements and resistive elements of the assembly. The gold layer in the regions of the conductive layers are plated with more gold and the resistive layer in the marginal areas is removed using the gold as a resist. Finally the remaining gold is etched to remove the gold layer from the regions of the resistive elements and to leave gold plating forming the conductive elements.

ELECTRICAL CIRCUITS ASSEMBLIES

FIELD OF THE INVENTION

The invention relates to a process for making electrical circuit assemblies having resistive elements formed by portions of a resistive layer on substrate and having conductors forming connections to said resistive elements and/or forming connectors to which components can be attached.

BACKGROUND TO THE INVENTION

Using gold conductors, joints can be effected by compression bonding and this is the most convenient technique because of the very small size of components assemblies nowadays employed. The use of gold wire is well known but involves considerable labor and it would therefore be very much more convenient if the gold conductors could be plated onto the substrate. One way that is being employed to do this is to coat the entire substrate with a resistive coating, plate the entire substrate over the resistive layer with gold and then remove the gold from the unwanted areas using a photolithographic process, covering with a resist the area of gold which is not to be removed. This procedure however is not very satisfactory because the plated gold surface is not smooth and it is therefore very difficult to perform good photolithography on the gold surface. The process moreover is uneconomical in the use of gold. Moreover, the gold is put over a resistive layer which is to be used for forming resistive elements, and there is considerable difficulty in etching away gold so as to leave an underlying resistive coating of constant width because of the undercutting of the gold which will necessarily occur during the etching process. Across large substrates, there may be considerable spread in resistance values. The problems of undercutting can be avoided by coating the entire substrate with a resistive layer and then plating the gold conductor only in the areas where the conductor is required but in such a process heretofore it has then been necessary, after the plating operation, to put a photoresist coating on surfaces which are not coplanar in order to remove the unwanted parts of the resistive layer. This results in over exposure and poor adhesion of the resist at the interfaces between the conductor and resistor. If a positive resist is used, that is to say a resist is used which can be exposed using a positive mask defining the areas where the electrical resistance is to be formed, there is "-necking down" of the resistance at the conductor/resistance interface resulting in a high current concentration. If a negative resist is used, it is necessary to employ a negative mask (which is more difficult to align) and inadequate exposure results in poor etch resistance of the resist and there is a risk of pin holes and open circuit conditions at the conductor/resistor interface.

It is an object of the present invention to provide an improved method of forming electric circuit assemblies using plated gold conductors on a substrate having a resistive coating to provide resistances where required.

SUMMARY OF THE INVENTION

With the present invention, a substrate is coated with a layer of resistive material. Substantially all this layer is then coated with a gold layer, which is preferably quite thin, such as between 2,000 to 4,000 Angstroms thick. In those areas (conveniently termed marginal areas) where neither resistive elements nor conductive elements are to be formed the gold layer is removed, preferably using a photoresist and an appropriate mask. Then the remaining gold layer is plated with gold in the regions where the conductive elements are to be formed but not in the regions of the resistive elements. The resistive layer is then removed from the marginal areas and finally the gold layer over the regions of the resistive elements is removed with an etchant. Although this final step may remove gold from the regions of the conductive elements, this removal will not matter because the gold in the latter regions will be thicker than the gold layer in the regions of the resistive elements.

With this technique the gold plating is effected only in the regions where the gold conductors are required; it is possible to plate only in these regions by making use of the underlying resistive layer to form a conductor which is in contact with all the regions where the gold plating is required.

The substrate is typically a glass of ceramic plate. The resistive layer may typically be a chromium, nickel, nickel chromium alloy, rhenium, nickel and silicon monoxide or similar resistance material and may be deposited by a vacuum deposition process e.g. evaporation of sputtering. The thin gold layer protects the resistive layer and enables the unwanted resistive coating to be etched away without having to put a photoresist on a nonplanar surface. Only a thin gold layer is required which can be etched evenly and quickly. This avoids the problem arising with thick films such as have been used heretofor that variations in etching occur leading to the formation of "silvers" between conductors.

Especially if the resistive material does not contain a substantially portion of chromium it is preferred to provide a very thin layer of chromium or titanium between the resistive layer and the gold layer to improve the adhesion thereof.

The gold layer may be deposited by a vacuum deposition technique. It would be preferable to remove the gold layer from the "marginal areas" by coating the gold layer with a photoresist and exposing the layer through a mask so as to expose for etching the areas whence gold is to be removed and etching away the gold. The plate can then be coated with a further photoresist and exposed through a mask to leave exposed for plating the regions on which the gold conductive elements are to be formed. Gold may be plated onto the exposed regions using the resistive layer as an electrical connection to all the exposed regions. The resistive layer can then be etched away from the whole region not covered with either the gold plating or the relatively thinner gold layer.

BRIEF DESCRIPTION OF THE DRAWINGS

In the accompanying drawings.

DESCRIPTION OF THE PREFERRED FORMS OF THE INVENTION

Figure 1:
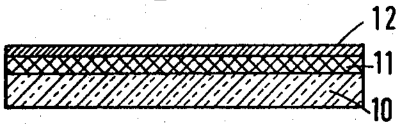
FIGS. 1 to 5 illustrate successive stages in the manufacture of an electrical circuit assembly in accord with the invention and FIG. 1A illustrates in more detail the stage illustrated by FIG. 1.

Referring to FIG. 1, a glass or ceramic plate 10 is used as the substrate. It is first coated over the entire surface on one face of the plate with a resistive layer 11 of chromium or nickel-chromium alloy. This coating is then coated all over with a thin layer 12 of gold (or layers of conductor material of which the last layer is gold), normally 99.99 percent pure.

The resistive layer would typically be very thin, for example 300 A, the thin gold layer which is put over this is again very thin and typically from 2,000–4,000 A. These two layers are applied using vacuum techniques, for example sputtering or evaporation techniques. Because these two layers are very thin, there is minimal risk of undercutting in the subsequent operation where photoresists are applied.

Figure 1A:
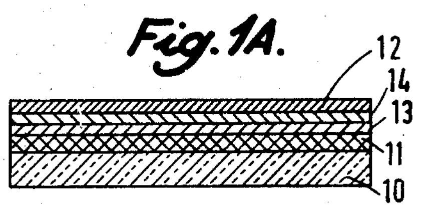

It is advisable to deposit an intermediate layer of chromium or titanium 20–100 angstroms thick to ensure adhesion to the resistive material. This latter step is conventional in all manufacturers process, especially if the resistive material does not contain a substantial portion of chromium. It may be advisable to include a layer of copper intermediate to the chromium and gold evaporation. The intermediate layer 13 of chromium and the additional layer of copper are illustrated in FIG. 1A, and would preferably always be provided: for simplicity the layers 13 and 14 are not shown in the other Figures.

To form the resistive and conductive pattern, the thin gold layer (and any underlying layer or layers of conductor material if such layers were put on under the gold) is etched away from the regions where the resistors or conductors are not required. Thus at this stage, the substrate is covered completely with the resistive coating and has a thin gold layer covering the resistance pattern and the conductor pattern.

Figure 2:
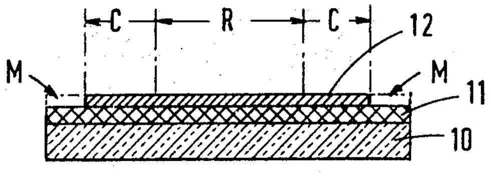

This condition is illustrated in FIG. 2 which is a diagram showing, for explanatory purposes, a step in the formation of a single-resistive element between two conductive regions. It will be understood that, in practice, there would normally be many resistive elements and many conductive regions formed on a single substrate. Some of the conductive regions would be for effecting connection to resistive elements but others may be for the effecting of connections to transistors or other components or for external connections. Referring to FIG. 2, after the etching of the thin gold layer, the whole substrate 10 is covered with the resistive layer 11; gold has been removed from marginal areas denoted M; and the gold layer 12 remains in the regions C of the conductive elements to be formed and the region R of the resistive element to be formed.

The coated substrate of FIG. 1 may be coated with Shipley's AZ1350 Positive Working Photoresist by placing the substrate on a fixture whereby the substrate is spun about its center at 3,000 r.p.m. after an excess of the photoresist material has been poured on the surface. The spinning action coats the substrate evenly with the resist material, the excess being shed into a shroud surrounding the fixture.

The substrate is then baked for 5 minutes at 70° C. to ensure drying of the resist and exposed to a light source through a photomask (known as the resistor mask) which contains both conductor areas and resistor areas. The substrate is subsequently developed in Shipley's AZ1350 Developer and then immersed for 30 seconds to 1 minute in a gold etchant whose composition is as follows:

100 ml. saturated solution of Potassium Iodide
12 g. Iodine

Immersion should only be for the time period necessary to remove the gold in the areas unprotected by the photoresist material. This etchant is important as it must be a type which does not attack the material of the resistive layer 11. This particular etchant will also work if a copper layer is interposed between the resistance material and the top gold conductor. The substrate now consists of a resistive layer covering the entire surface with a gold circuit pattern upon it as shown in FIG. 2. The AZ1350 photoresist covering the gold is removed with acetone or an alternate suitable stripping agent.

To effect the gold plating, it is preferable to use a negative resist and to expose the assembly through a positive mask of the conductor pattern. The plating is effected to build up the gold conductors which typically might be 10 times as thick as the aforementioned thin gold layer.

The preparation for plating and the actual plating may be performed as follows:

The substrate of FIG. 2 is coated as previously described by spin coating with Kodak Photoresist, Kodak Thin Film Resist, Kodak Metal Etch Resist or a suitable alternative product, depending on the type of plating bath used. The spin speed is 1,500 r.p.m. and the resultant photoresist film is approximately 0.3 to 1 mil. in thickness, depending on the viscosity of the resist. Resolution and exposure time, plus the necessary gold thickness determine the resist thickness desired. It is advisable to have a resist approximately 70 percent of the final plated thickness to maintain good resolution.

The Kodak photoresists mentioned are negative working resists. The areas to be plated is thus an area which is not exposed. The photomask is a positive (i.e. conductor areas are black or opaque) making alignment of the conductor pattern to the resistor pattern simpler than if the mask was a negative (i.e. conductors were clear on a black background). The conductor mask is aligned with the gold resistor pattern in a conventional microcircuit alignment fixture. The pattern is exposed and developed and postbaked for at least 20 minutes at 70° C.

The conductor pattern is now ready for plating. To ensure good adhesion of the plated gold, the surface is cleaned and activated by a short immersion in a diluted 10:1 version of the previous Potassium Iodide-Iodine etchant. The desired surface is an even "matte" finish on the gold in the areas of the conductors. The entire substrate is then carefully rinsed in deionized water to remove all traces of gold etchant.

The substrate is then placed in a suitable fixture which makes electrical contact to the resistive underlayer at the edges of the substrate through the photoresist (i.e. it punctures or scrapes away the resist in the contact area). This fixture (the cathode) is then connected to the negative side of the plating supply and immersed in the gold-plating bath. The anode is normally platinized titanium. The fixture is vigorously agitated mechanically and the solution is also agitated during the plating process to ensure a smooth and even deposit. The plating bath manufacturers' recommendations should be followed for current density and bath temperature. The bath utilized preferably is Sel Rex Pura-gold 125 with a current density of 5 amps/square foot and a bath temperature of 55° C. Plating time is a function of required thickness of deposit.

Subsequent to plating the substrate is rinsed thoroughly in deionized water to remove all traces of plating solution and the photoresist is removed using a commercial "stripping" solution mixed with Trichoroethylene.

Figure 3:
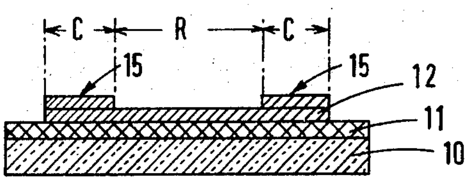

The result at the end of the plating stage is illustrated in FIG. 3. The substrate 10 is still covered by the resistive layer 11. Gold plating 15 is built upon the regions C for the conductive elements. The region R of the resistive element is still covered by the thin layer 12 of gold.

To remove the resistive layer in the unwanted region, use is made of the gold as a resist. The previous photoresist is therefore removed and the assembly is then immersed in a suitable etching solution to remove the resistive layer in the unwanted regions. This step then leaves the assembly with a substrate having the required gold conductive pattern and having in addition the resistive pattern which resistive pattern is covered by the thin gold layer.

The removal of the unwanted resistive layer may proceed as follows. The substrate of FIG. 3 is immersed and agitated in a resistive material etchant which does not attack the gold or copper-gold conductor layers. If a copper underlayer is not utilized the etchant composition is:

50 ml. deionized water
10 ml. nitric acid
2 g. cerium sulphate

If the copper underlayer is used the etchant composition is:

Part 1/100 ml. deionized water
4 g. Potassium Permanganate
Part 2/100 ml. deionized water
100 g. Sodium Hydroxide
Mixed just prior to etching or 100 ml. deionized water
10 g. Potassium Ferricyanide
10 ml. Potassium Hydroxide The latter etchant is to be preferred as it is clear and the progress of etching can be clearly observed. It is important that overetching does not occur, and that the resistive layer is evenly removed from the entire substrate.

Excessive time in the resistive etchant results in severe undercutting of the resistive layer where it is masked by the unplated gold layer, and attack of the resistors through pinholes present in the evaporated gold-masking layer 12. The substrate is rinsed with deionized water to remove excess etchant.

Figure 4:
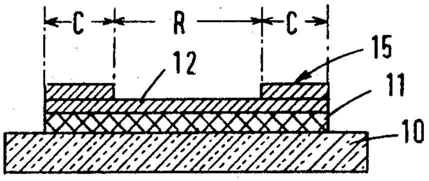

The present state of the substrate is illustrated by FIG. 4.

The final stage is the removal of the thin gold layer 12 from the region R of the resistive element. Etching away the layer 12 will also remove a small amount of gold from the required conductive areas 13 but these are so much thicker that this removal does not matter. This final stage is preferably carried out as follows:

The substrate of FIG. 4 is immersed and agitated in the Potassium iodide-iodine conductor etchant of previous mention to remove the evaporated gold on the surface of the resistor area. The copper interlayer, if utilized, is also removed by this etchant. The inclusion of the copper interlayer indicates a reduced diffusion of chromium of nichrome-resistance material into the gold conductor layer. Platinum and possibly molybdenum might also be used for this purpose. The diffusion of the resistance material, acting as the plating cathode, is enhanced during the plating procedure and with subsequent heat processing. It is considered that this diffusion can lead to current redistributions at the resistor conductor interface resulting in component failures due to open circuit conditions.

Figure 5:
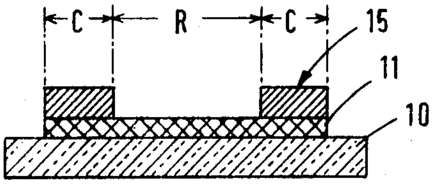

The result of the final stage is shown in FIG. 5 wherein the regions C are formed with plated gold and the resistive region R comprises an exposed area of the resistive layer 11 which acts as an electrical connection between the conductive elements.

It will be seen that this technique avoids all problems of having to apply a photoresist over the nonplanar surface at the interface between the conductive regions and resistive elements. Absence of these problems permits the electroforming conductive pillars or other conductive elements of small surface area on an essentially two dimensional plane.

I claim:

1. A method of making an electrical circuit assembly having resistive elements and conductive elements, the method comprising the steps of: coating a substrate with a resistive layer, coating the whole resistive layer with a thin layer of gold, selectively removing said gold from marginal areas not associated with the resistive elements and conductive elements, selectively plating with more gold the gold layer in the regions of the conductive elements, selectively removing said resistive layer from the regions of the said marginal areas, and etching the said gold layer so as to remove said gold layer from the regions of said resistive elements and to leave a gold plating forming the conductive elements.

2. A method as claimed in claim 1 in which the plating step includes using said resistive layer to form an electrical connection between all the regions of the desired conductive elements.

3. A method as claimed in claim 1, comprising also the step of forming an additional intermediate adhesion-improving layer between the resistive layer and said gold layer.

4. A method as claimed in claim 3 comprising also providing a layer of copper between said intermediate layer and the gold layer.

5. A method as claimed in claim 1 in which the step of coating the substrate with a resistive layer comprises forming said layer by vacuum deposition.

6. A method as claimed in claim 1 in which said gold layer is deposited to a thickness of between 2,000 and 4,000 Angstroms.

7. A method as claimed in claim 6 in which the gold layer is formed by vacuum deposition.

8. A method as claimed in claim 1 in which the step of selectively removing gold from the marginal areas comprises coating the gold layer with a photoresist, exposing the gold layer through a mask so as to expose the marginal areas for etching, and etching said marginal areas.

9. A method as claimed in claim 8 in which the etchant comprises a saturated solution of potassium iodide and iodine.

10. A method as claimed in claim 1 in which the plating step comprises coating the gold layer with a photoresist, exposing the gold layer using a mask so as to develop the photoresist selectively over the region of desired resistive elements, and gold-plating said gold layer in the regions of said desired conductive elements.

11. A method as claimed in claim 10 in which the gold layer is etched to have a matte surface before it is plated.

12. A method as claimed in claim 10 in which the plating step comprises also using a plating bath which includes an anode and a cathode and connecting said resistive layer to said cathode.

13. A method as claimed in claim 1 in which the said etching step comprises etching with a solution of potassium iodide and iodine.

14. A method as claimed in claim 1 in which the step of selectively removing the resistive layer comprises etching.

* * * * *